(12) United States Patent
Fisher et al.

(10) Patent No.: US 9,284,656 B2
(45) Date of Patent: *Mar. 15, 2016

(54) USE OF METAL PHOSPHORUS IN METALLIZATION OF PHOTOVOLTAIC DEVICES AND METHOD OF FABRICATING SAME

(75) Inventors: Kathryn C. Fisher, Brooklyn, NY (US); Qiang Huang, Sleepy Hollow, NY (US); Satyavolu S. Papa Rao, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 963 days.

This patent is subject to a terminal disclaimer.

(21) Appl. No.: 13/154,058

(22) Filed: Jun. 6, 2011

(65) Prior Publication Data

US 2012/0305066 A1 Dec. 6, 2012

(51) Int. Cl.
| | |
|---|---|
| *C25D 3/56* | (2006.01) |
| *C25D 3/58* | (2006.01) |
| *H01L 21/288* | (2006.01) |
| *H01L 23/532* | (2006.01) |
| *H01L 21/768* | (2006.01) |
| *H01L 31/0224* | (2006.01) |
| *C25D 3/38* | (2006.01) |
| *C25D 3/60* | (2006.01) |

(Continued)

(52) U.S. Cl.
CPC .. *C25D 3/58* (2013.01); *C25D 3/38* (2013.01); *C25D 3/56* (2013.01); *C25D 3/562* (2013.01); *C25D 3/567* (2013.01); *C25D 3/60* (2013.01); *C25D 3/62* (2013.01); *C25D 3/64* (2013.01); *C25D 5/006* (2013.01); *C25D 5/10* (2013.01); *C25D 5/12* (2013.01); *C25D 5/50* (2013.01); *C25D 7/12* (2013.01); *H01L 21/2885* (2013.01); *H01L 21/76841* (2013.01); *H01L 23/53238* (2013.01); *H01L 31/022425* (2013.01); *H01L 2924/0002* (2013.01); *Y02E 10/50* (2013.01)

(58) Field of Classification Search
CPC ...................... H01L 21/2885; H01L 23/53238
USPC .................... 136/256; 257/E31.12; 438/72
See application file for complete search history.

(56) References Cited

U.S. PATENT DOCUMENTS

| | | |
|---|---|---|
| 4,609,565 A | 9/1986 | Yates |
| 5,258,077 A | 11/1993 | Shahryar |

(Continued)

FOREIGN PATENT DOCUMENTS

| | | | |
|---|---|---|---|
| WO | WO 2008100603 A1 * | 8/2008 | |
| WO | WO 2010088898 A2 * | 8/2010 | ...... H01L 31/022425 |

OTHER PUBLICATIONS

Becker et al., WO2010088898A2, English Machine Translation, pp. 1-33.*

*Primary Examiner* — Matthew Martin
*Assistant Examiner* — Tae-Sik Kang
(74) *Attorney, Agent, or Firm* — Scully, Scott, Murphy & Presser, P.C.; Louis J. Percello, Esq.

(57) ABSTRACT

A photovoltaic device, such as a solar cell, including a copper-containing-grid metallization structure that contains a metal phosphorus layer as a diffusion barrier is provided. The copper-containing-grid metallization structure includes, from bottom to top, an electroplated metal phosphorus layer that does not include copper or a copper alloy located within a grid pattern formed on a front side surface of a semiconductor substrate, and an electroplated copper-containing layer. A method of forming such a structure is also provided.

18 Claims, 4 Drawing Sheets

(51) Int. Cl.
*C25D 3/62* (2006.01)
*C25D 3/64* (2006.01)
*C25D 5/10* (2006.01)
*C25D 5/12* (2006.01)
*C25D 5/50* (2006.01)
*C25D 7/12* (2006.01)
*C25D 5/00* (2006.01)

(56) References Cited

U.S. PATENT DOCUMENTS

| | | |
|---|---|---|
| 5,543,333 A | 8/1996 | Holdermann |
| 2004/0104479 A1* | 6/2004 | Daimon et al. ............... 257/753 |
| 2008/0121276 A1* | 5/2008 | Lopatin et al. ................ 136/256 |
| 2010/0304519 A1* | 12/2010 | Eickelmann et al. ........... 438/68 |

* cited by examiner

USE OF METAL PHOSPHORUS IN METALLIZATION OF PHOTOVOLTAIC DEVICES AND METHOD OF FABRICATING SAME

BACKGROUND

The present disclosure relates to a photovoltaic device and a method of manufacturing the same. More particularly, the present disclosure relates to a photovoltaic device, such as a solar cell, including a copper-containing-grid metallization structure that contains a metal phosphorus layer as a diffusion barrier. The present disclosure also provides a method for forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom. Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped regions, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

The majority of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

For advanced and experimental high efficiency solar cells in laboratories, vacuum based metallization processes are used with an inevitable higher cost and low throughput.

Very recently, metallization with a plated copper grid has been reported. However, the plated copper can easily diffuse into the silicon solar cells and damage the solar cells performance. To prevent this detrimental effect, diffusion barriers, such as nickel silicide and nickel, have been employed. However, even with these diffusion barriers, copper diffusion may still occur at a certain elevated temperature or after a certain long time of operation.

SUMMARY

A photovoltaic device, such as a solar cell, including a copper-containing-grid metallization structure that contains a metal phosphorus layer as a diffusion barrier is provided. The copper-containing-grid metallization structure includes, from bottom to top, an electroplated metal phosphorus layer that is located within a grid pattern formed on a front side surface of a semiconductor substrate, and an electroplated copper-containing material layer located atop the metal phosphorus layer. The metal phosphorus layer comprises a metal or metal alloy that is different from the copper-containing material layer. That is, the metal phosphorus layer does not include copper or a copper alloy therein. A method of forming such a structure is also provided.

In one embodiment of the present disclosure, a method of forming a copper-containing-grid metallization structure that contains a metal phosphorus layer as a diffusion barrier is provided. Specifically, a method is provided that includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate. Next, patterned antireflective coatings are formed on the front side surface of the semiconductor substrate to provide a grid pattern on the front side surface. The grid pattern comprises exposed portions of the front side surface of the semiconductor substrate. A metal phosphorus layer which does not include copper or a copper alloy is then electrodeposited on the exposed portions of the front side surface of the semiconductor substrate. After electrodepositing the metal phosphorus layer, a copper-containing layer is electrodeposited atop the metal phosphorus layer.

In one embodiment, the n-type semiconductor portion overlies the p-type semiconductor portion. In another embodiment, the p-type semiconductor overlies the n-type semiconductor portion.

In some embodiments of the present disclosure, a metal semiconductor alloy layer can be formed on the exposed portions of the front side surface of the semiconductor substrate prior to forming the metal phosphorus layer.

In another embodiment, a photovoltaic device is provided that includes a conductive material-grid metallization structure that contains a metal phosphorus layer as a diffusion barrier. Specifically, the structure of the present disclosure includes a semiconductor substrate including a p-n junction with a p-type semiconductor portion and an n-type semiconductor portion one on top of the other, wherein an upper exposed surface of one of the semiconductor portions represents a front side surface of the semiconductor substrate. The structure further includes patterned antireflective coatings on the front side surface of the semiconductor substrate, wherein the patterned antireflective coatings protect some portions of the front side surface of the semiconductor substrate, while leaving other portions of the front side surface of the semiconductor substrate exposed, the other portions of the front side surface of the semiconductor substrate that are exposed form a grid pattern on the front side surface. The structure yet further includes a metal phosphorus layer located on the other portions of the front side surface of the semiconductor substrate that are exposed and a copper-containing layer located atop the metal phosphorus layer. In accordance with the present disclosure, the metal phosphorus layer does not include copper or a copper alloy.

In one embodiment, the n-type semiconductor portion overlies the p-type semiconductor portion. In another embodiment, the p-type semiconductor overlies the n-type semiconductor portion.

In some embodiments of the present disclosure, a metal semiconductor alloy layer is interposed between the exposed portions of the front side surface of the semiconductor substrate and the metal phosphorus layer.

DETAILED DESCRIPTION

The present disclosure, which provides photovoltaic devices, such as solar cells, having a metal phosphorus diffusion barrier located between a semiconductor material and an overlying copper-containing layer, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
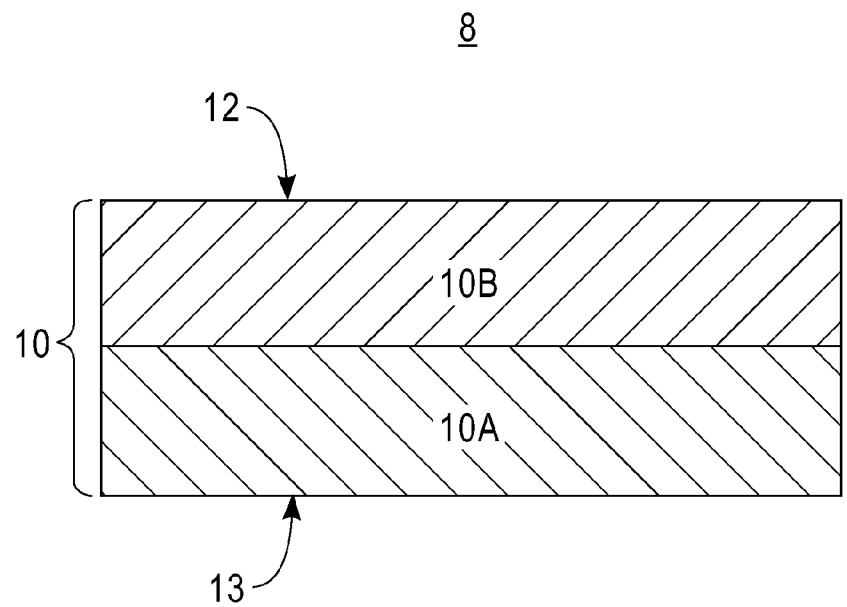
FIG. 1 is a pictorial representation (through a cross sectional view) illustrating an initial structure that can be employed in one embodiment of the present disclosure.

Referring now to FIG. 1, there is illustrated an initial structure 8 that can be employed in one embodiment of the present disclosure. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP, CdTe, CuInSe$_2$, Cu(InGa)Se$_2$, and all other III/V, II/VI, or I/III/VI compound semiconductors. In one embodiment of the present disclosure, the semiconductor substrate 10 is comprised of Si. In another embodiment, the semiconductor substrate 10 is comprised of a single crystalline semiconductor material. In another embodiment, the semiconductor substrate 10 is comprised of a multicrystalline semiconductor material. In yet another embodiment, the semiconductor substrate 10 is comprised of multiple layers of different semiconductor materials, for example, with different energy band gaps.

The semiconductor substrate 10 illustrated in FIG. 1 includes a p-type semiconductor portion 10A that includes a p-type dopant, and an overlying n-type semiconductor portion 10B that includes an n-type dopant. In some embodiments (not shown), the p-type semiconductor portion of the substrate overlies the n-type semiconductor portion. In such an embodiment, the order of layers 10A and 10B would be reversed from that shown, i.e., layer 10A would be located atop layer 10B. Also, in such an embodiment, an exposed surface of layer 10A would be used as the front side surface of the semiconductor substrate 10.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor substrate and the type of dopant atom being employed. The p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments of the present disclosure, the dopant(s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of a single crystalline silicon semiconductor substrate. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

Although the following drawings and description illustrate processing the n-type semiconductor portion 10B of the semiconductor substrate 10, the following description can also be applied to processing the p-type semiconductor portion of the semiconductor substrate 10 in embodiments in which the p-type semiconductor portion is located atop the n-type semiconductor portion.

Figure 2:
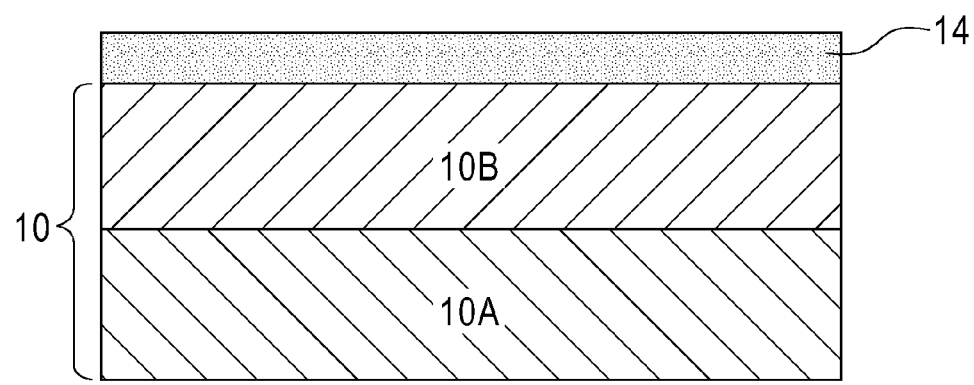
FIG. 2 is a pictorial representation (through a cross sectional view) illustrating the initial structure of FIG. 1 after forming a blanket layer of an antireflective coating on a front side surface of the initial structure.

Referring now to FIG. 2, there is illustrated the structure of FIG. 1 after forming a blanket layer of an antireflective coating (ARC) 14 on the front side surface 12 of the n-type semiconductor portion 10B of the semiconductor substrate 10. The blanket layer of ARC 14 that can be employed in the present disclosure includes a conventional ARC material such as, for example, an inorganic ARC or an organic ARC. In one embodiment of the present disclosure, the ARC material comprises silicon nitride. The blanket layer of ARC 14 can be formed utilizing techniques well known to those skilled in the art. For example, an ARC composition can be applied to the front side surface 12 of the semiconductor substrate 10 (i.e., directly onto the exposed upper surface of the n-type semiconductor portion 10B) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

At this point of the present disclosure, the back side surface 13 of the p-type semiconductor portion 10A of the semiconductor substrate 10 may be processed to form a metal back side surface electrical contact (not shown in the drawings of the present disclosure). When the substrate 10 includes a p-type semiconductor portion atop an n-type semiconductor portion, the bottommost surface of the n-type semiconductor portion would represent the back side surface of the substrate which could be processed to include a metal back side surface electrical contact. In one embodiment, the metal back side surface electrical contact can be formed by applying a metallic paste, such as Al paste, Ag paste, or AlAg paste, to the back side surface 13 of the semiconductor substrate 10. After applying the metallic paste, the applied metallic paste is heated at an elevated temperature (typically between 700° C. to 900° C.) which causes the metallic paste to flow and form a metal back surface field, i.e., the back side surface electrical contact, of the structure.

Figure 3:
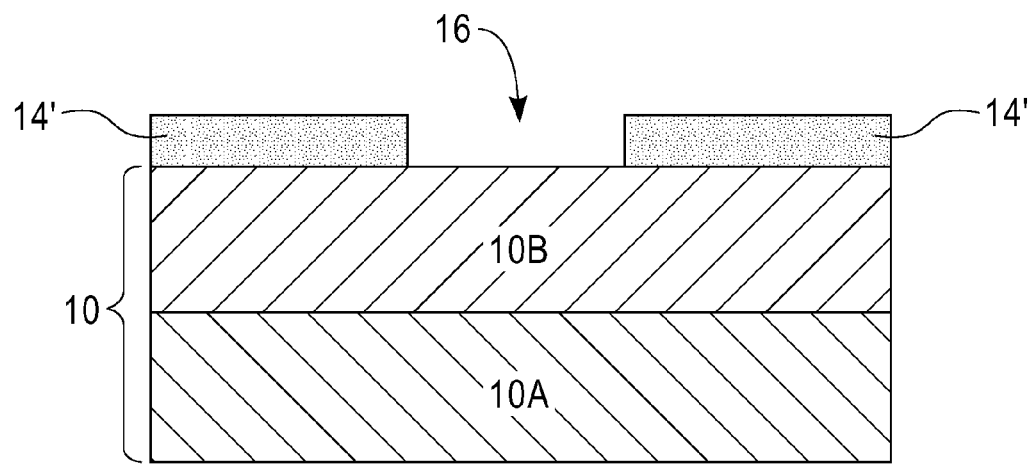
FIG. 3 is a pictorial representation (through a cross sectional view) illustrating the structure of FIG. 2 after patterning the blanket layer of antireflective coating forming a plurality of patterned antireflective coatings having one or a plurality of open grid patterns.

Referring now to FIG. 3, there is illustrated the structure of FIG. 2 after patterning the blanket layer of ARC 14 forming a plurality of patterned antireflective coatings (ARCs) 14' having an open grid pattern 16 located therein. Although the cross sectional drawings show the presence of a single opening formed into the blanket layer of ARC 14, a plurality of such openings would be formed providing a grid pattern to the front side surface 12 of the semiconductor substrate 10. In one embodiment, the plurality of patterned ARCs 14' can be formed by lithography and etching. The lithographic process includes applying a photoresist (not shown) to an upper surface of the blanket layer of ARC 14, exposing the photoresist to a desired pattern of radiation and developing the exposed photoresist utilizing a conventional resist developer. A patterned photoresist is thus provided. The pattern in the photoresist is transferred to the blanket layer of ARC 14 utilizing an etching process such as, for example, dry etching or chemical wet etching. After transferring the pattern from the patterned photoresist to the underlying blanket layer of ARC 14, the patterned photoresist is typically removed from the structure utilizing a conventional resist stripping process such as, for example, ashing. In another embodiment, the blanket layer of ARC 14 can be patterned utilizing ink jet printing or laser ablation. In yet another embodiment, the exposed semiconductor surface 12 in the pattern region 16 of ARC 14 can be further treated to increase the doping level. In these cases, the top semiconductor material 10B is thicker or has higher dopant concentration under the exposed region 16.

Figure 4:
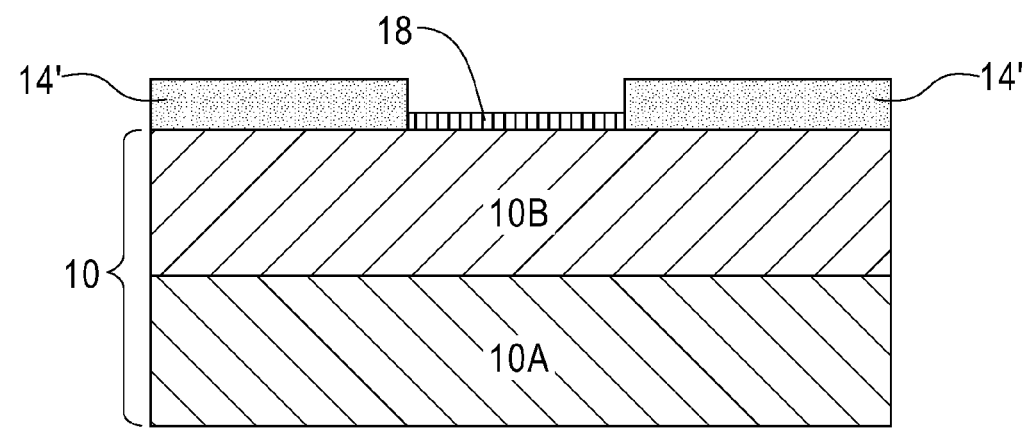
FIG. 4 is a pictorial representation (through a cross sectional view) illustrating the structure of FIG. 3 after electrodepositing, i.e., electroplating, a metal phosphorus layer into the open grid pattern.

Referring now to FIG. 4 there is illustrated the structure of FIG. 3 after forming a metal phosphorus layer 18 within the grid pattern, i.e., on the exposed front side surface 12 of the semiconductor substrate 10, of the structure by electrodeposition, i.e., electroplating. In the present disclosure, the metal phosphorus layer 18 serves as a diffusion barrier for an overlying Cu-containing conductive material to be subsequently formed.

The metal phosphorus layer 18 that is formed includes a metal or metal alloy and phosphorus. In one embodiment of the present application, the metal component of the metal phosphorus layer 18 can be comprised of Ni, Co, Zn, Pt, Ag, Pd, Sn, Fe, In or alloys thereof, with the proviso that the metal component of the metal phosphorus layer 18 does not comprise copper or a copper alloy. In another embodiment, the metal component of the metal phosphorus layer 18 may be comprised of Ni, Co, Zn, Pt, Fe or alloys thereof. In a further embodiment of the present disclosure, the metal component of the metal phosphorus layer 18 may be comprised of Ni or a Ni alloy. In a yet further embodiment of the present disclosure, the metal component of the metal phosphorus layer 18 may be comprised of Co or a Co alloy. In any of the embodiments mentioned above, the metal component of the metal phosphorus layer, and hence the metal phosphorus layer 18 itself does not include copper or a copper alloy.

In one embodiment of the present application, the phosphorus component of the metal phosphorus layer 18 may be present in a concentration from 1 atomic percent to 50 atomic percent phosphorus, the remaining being either the metal component alone, or the metal component together with other impurities. In another embodiment of the present application, the phosphorus component of the metal phosphorus layer 18 may be present in a concentration from 5 atomic percent to 20 atomic percent phosphorus, the remaining being either the metal component alone, or the metal component together with other impurities.

In some embodiments, and prior to the electrodeposition of the metal phosphorus layer 18, the exposed surface(s) of the front side surface 12 of the semiconductor substrate 10 can be cleaned using a conventional cleaning process that is well known to those skilled in the art which is capable of removing surface oxides and other contaminants from the exposed surface(s) of the semiconductor material. For example, a diluted HF solution can be used to clean the exposed front side surface of the semiconductor substrate 10.

The electrodeposition method of the present application includes the use of any conventional electroplating apparatus that is well known to those skilled in the art. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the exposed portions of the front side surface 12 of the semiconductor substrate 10 (i.e., either the n-type semiconductor portion 10B, if the n-type semiconductor portion is located atop the p-type semiconductor portion, or the p-type semiconductor portion, if the p-type semiconductor portion is located atop the n-type semiconductor portion) are employed as the cathode of the circuit. The anode that is employed in the electrodeposition process may or may not be made of the same metal as to be plated. In the present disclosure, the structure shown in FIG. 3 is immersed in an electroplating bath (e.g., an electrolyte) containing an anode and one or more dissolved metal salts (to be further defined here below) and a phosphorus source as well as other ions that permit the flow of electricity. A power supply supplies a direct current to the anode and plating occurs at the cathode (i.e., the exposed front side surface 12 of the semiconductor substrate).

The electroplating bath that can be employed in the present disclosure includes one or more sources of metal ions, and one or more sources of phosphorus ions, to plate metal phosphorus layer 18. The one or more sources of metal ions provide metal ions which include, but are not limited to, Ni, Co, Zn, Pt, Ag, Pd, Sn, Fe and In. Alloys that can be electrodeposited (or plated) include, but are not limited to, binary and ternary alloys of the foregoing metals. In one embodiment, metals chosen from Ni, Co, Zn, Pt and Fe are plated from the electroplating bath. In another embodiment, Ni or a Ni alloy is plated from the electroplating bath. In yet another embodiment, Co or a Co alloy is plated from the electroplating bath.

The one or more sources of phosphorus ions provide phosphorus to the bath which include, but are not limited to, phosphorus acid, hypophosphate and hypophosphorus acid. In one embodiment, the aforementioned sources of phosphorus can be present in the plating bath in a concentration from 0.1 g/L to 100 g/L. In another embodiment, the aforementioned sources of phosphorus can be present in the plating bath in a concentration from 1 g/L to 20 g/L. In yet another embodiment, the aforementioned sources of phosphorus can be present in the plating bath in a concentration from 1 g/L to 10 g/L.

The one or more sources of metal ions that can be present in the electroplating bath include metal salts. The metal salts that can be used include, but are not limited to, metal halides, metal nitrates, metal sulfates, metal sulfamates, metal alkane sulfonates, metal alkanol sulfonate, metal cyanides, metal acetates or metal citrates.

Some of the various types of metal salts that can be employed in the present disclosure are now described in greater detail.

Tin (Sn) salts which may be used in the electroplating bath include, but are not limited to, one or more of tin sulfates, tin halides, tin alkane sulfonates such as tin methane sulfonate, tin ethane sulfonate, and tin propane sulfonate, tin aryl sulfonate such as tin phenyl sulfonate and tin toluene sulfonate, and tin alkanol sulfonate. Typically, tin sulfate or tin alkane sulfonate is used in the electroplating bath.

Gold (Au) salts which may be used in the electroplating bath include, but are not limited to, one or more of gold trichloride, gold tribromide, gold cyanide, potassium gold chloride, potassium gold cyanide, sodium gold chloride and sodium gold cyanide.

Silver (Ag) salts which may be used in the electroplating bath include, but are not limited to, one or more of silver nitrate, silver chloride, silver acetate and silver bromate. Typically, silver nitrate is used in the electroplating bath.

Nickel (Ni) salts which may be used in the electroplating bath include, but are not limited to, one or more of nickel chloride, nickel sulfamate, nickel acetate, nickel ammonium sulfate, and nickel sulfate.

Palladium (Pd) salts which may be used in the electroplating bath include, but are not limited to, one or more of palladium chloride, palladium nitrate, palladium potassium chloride and palladium potassium chloride.

Platinum (Pt) salts which may be use include, but are not limited to, one or more of platinum tetrachloride, platinum sulfate and sodium chloroplatinate.

Indium (In) salts which may be used include, but are not limited to, one or more of indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine.

Sources of cobalt (Co) ions include, but are not limited to, one or more of cobalt ammonium sulfate, cobalt acetate, cobalt sulfate and cobalt chloride. Sources of zinc (Zn) ions include, but are not limited to, one or more of zinc bromate, zinc chloride, zinc nitrate and zinc sulfate. Source of iron (Fe) include, but are not limited to, one or more of ferric or ferrous chloride, iron nitrate, iron sulfate, iron acetate, and iron sulfate.

In general, the metal salts are included in the electroplating bath such that metal ions range in concentrations from 0.01 g/L to 200 g/L, or such as from 0.5 g/L to 150 g/L, or such as from 1 g/L to 100 g/L, or such as from 5 g/L to 50 g/L. Typically, metal salts are included in amounts such that metal ion concentrations range from 0.01 to 100 g/L, more typically from 0.1 g/L to 60 g/L.

The electroplating bath that can be used may include one or more conventional diluents. Typically, the electroplating bath is aqueous; however, conventional organic diluents may be used if desired. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds.

Suppressors include, but are not limited to, one or more of oxygen containing high molecular weight compounds such as carboxymethylcellulose, nonylphenolpolyglycol ether, octandiolbis-(polyalkylene glycolether), octanolpolyalkylene glycolether, oleic acidpolyglycol ester, polyethylenepropylene glycol, polyethylene glycol, polyethylene glycoldimethylether, polyoxypropylene glycol, polypropylene glycol, polyvinylalcohol, stearic acidpolyglycol ester, and stearyl alcoholpolyglycol ether. Typically poly(alkoxylated)glycols are used. Such suppressors may be included in the electroplating bath in conventional amounts, such as from 0.01 g/L to 10 g/L, or such as from 0.5 g/l to 5 g/L.

One or more conventional surfactants may be used. Typically, surfactants include, but are not limited to, nonionic surfactants such as alkyl phenoxy polyethoxyethanols. Other suitable surfactants containing multiple oxyethylene groups also may be used. Such surfactants include compounds of polyoxyethylene polymers having from as many as 20 to 7500 repeating units. Such compounds also may perform as suppressors. Also included in the class of polymers are both block and random copolymers of polyoxyethylene (EO) and polyoxypropylene (PO). Surfactants may be added in conventional amounts, as from 0.5 g/L to 20 g/L, or such as from 5 g/L to 10 g/L.

Conventional levelers include, but are not limited to, one or more of alkylated polyalkyleneimines and organic sulfo sulfonates. Examples of such compounds include 1-(2-hydroxyethyl)-2-imidazolidinethione (HIT), 4-mercaptopyridine, 2-mercaptothiazoline, ethylene thiourea, thiourea, 1-(2-hydroxyethyl)-2-imidazolidinethione (HIT) and alkylated polyalkyleneimines. Such levelers are included in conventional amounts. Typically, such levelers are included in amounts of 1 ppb to 1 g/L, or such as from 10 ppb to 500 ppm.

One or more inorganic and organic acids can be also included in the electroplating bath to increase the solution conductivity of the matrix and also to adjust the pH of the plating composition. Inorganic acids include, but are not limited to, sulfuric acid, hydrochloric acid, nitric acid and phosphoric acid. Organic acids include, but are not limited to, alkane sulfonic acids, such a methane sulfonic acid. Acids are included in the electroplating bath in conventional amounts.

Alkali metal salts which may be included in the electroplating bath include, but are not limited to, sodium and potassium salts of halogens, such as chloride, fluoride and bromide. Typically chloride is used. Such alkali metal salts are used in conventional amounts.

In addition to the above, the electroplating bath may also include hardeners, malleability, ductility and deposition modifiers, and the like.

The measured pH of the electroplating bath may range from −1 to 14, or such as from −1 to 8. Typically, the pH of the electroplating bath ranges from −1 to 5, more typically, from −1 to 3. Conventional buffering compounds may be included to control the pH of the electroplating bath.

The electroplating baths are typically maintained in a temperature range of from 20° C. to 110° C., with a temperature from 20° C. to 50° C. being more typical. Plating temperatures may vary depending on the metal to be plated.

The electrodeposition process employed in forming the metal phosphorus layer 18 uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the metal phosphorus layer 18.

By "low current density" it is meant a plating density within a range from 1 mAmps/cm$^2$ to 40 mAmps/cm$^2$. By "high current density" it is meant a plating density of greater than 20 mAmps/cm$^2$ (a general range for the high current density regime is from greater than 20 mAmps/cm$^2$ to 200 mAmps/cm$^2$. The increase from the low current density regime to the high current density regime or decrease from the high current density regime to the low current density regime may include a continuous ramp or it may include various ramp and soak cycles including a sequence of constant current plateaus.

In some embodiments of the present disclosure, light illumination can be used to increase metal nucleation and growth during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source can be used. The intensity of the light employed may vary and is typically greater than 50 W/m$^2$, with an intensity of light from 100 W/m$^2$ to 500 W/m$^2$ being more typical. The combination of the aforementioned waveform and light illumination enables one to provide complete coverage of a metallic film on the surface of a semiconductor substrate used in solar cell applications.

The thickness of the metal phosphorus layer 18 that is electrodeposited may vary depending on the type of metal source and phosphorus source being electrodeposited, the type of electroplating bath employed as well as the duration of the electrodeposition process itself. Typically, the metal phosphorus layer 18 that is formed has a thickness from 10 nm to 1000 nm, with a thickness from 50 nm to 300 nm being more typical.

Figure 5:
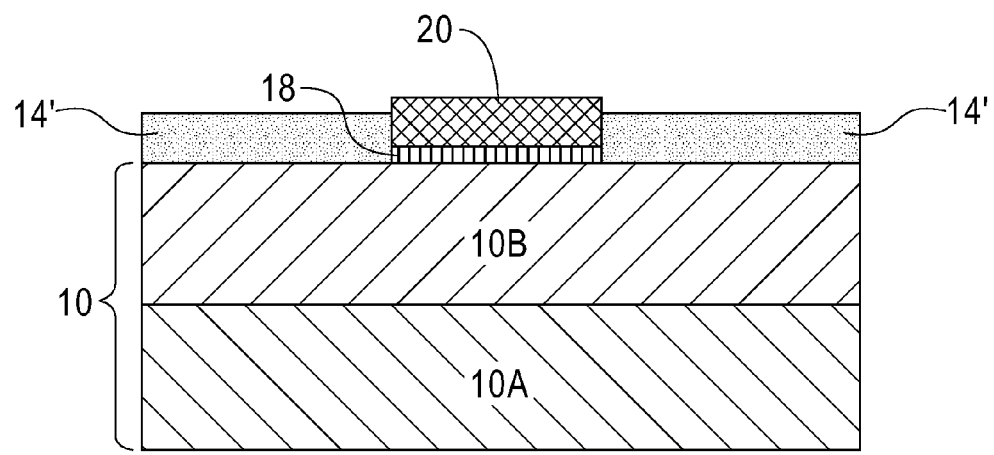
FIG. 5 is a pictorial representation (through a cross sectional view) illustrating the structure of FIG. 4 after electrodepositing a copper-containing layer on an upper surface of the metal phosphorus layer.

Referring now to FIG. 5, there is illustrated the structure of FIG. 4 after electrodepositing a copper-containing layer 20 atop the metal phosphorus layer 18. The copper-containing layer 20 that is formed atop the metal phosphorus layer 18 comprises copper or a copper alloy. In one embodiment, the copper-containing layer 20 can be comprised of Cu, while the metal phosphorus layer 18 can be comprised of NiP or CoP.

The electrodeposition of copper-containing layer 20 atop the metal phosphorus layer 18 is the same as that described above for electrodeposition of the metal phosphorus layer 18 except that no source of phosphorus and at least one source of copper ions is present in the bath used in forming the copper-containing layer 20.

The one or more sources of copper ions that can be present in the electroplating bath to form the copper-containing layer 20 include copper salts such as, but not limited to, copper halides, copper nitrates, copper sulfates, copper sulfamates, copper alkane sulfonates, copper alkanol sulfonate, copper pyrophosphate, copper cyanides, copper acetates and copper citrates. The bath used to plate the copper-containing layer 20 may also include one or more of the sources of metal ions mentioned above in forming the metal phosphorus layer 18.

The copper salts are included in the electroplating bath such that copper ions range in concentrations from 0.01 g/L to 200 g/L, or such as from 0.5 g/L to 150 g/L, or such as from 1 g/L to 100 g/L, or such as from 5 g/L to 50 g/L. Typically, copper salts are included in amounts such that copper ion concentrations range from 0.1 g/L to 100 g/L, more typically from 1 g/L to 60 g/L.

In some embodiments, the electrodeposition of the copper-containing layer 20 can also include light illumination (as mentioned above) to increase metal nucleation and growth during the electrodeposition process.

The copper-containing layer 20 that is electroplated atop the metal phosphorus layer 18 has a thickness that is generally greater than the thickness of that of the metal phosphorus layer 18. In one embodiment, the copper-containing layer 20 has a thickness from 100 nm to 50000 nm. In another embodiment, the copper-containing layer 20 has a thickness from 1000 nm to 10000 nm.

After forming the copper-containing layer 20 atop the metal phosphorus layer 18, the copper-containing layer 20 can be further processed to include other material layers such as, but not limited to, diffusion barrier layers and/or passivation layers.

Figure 6:
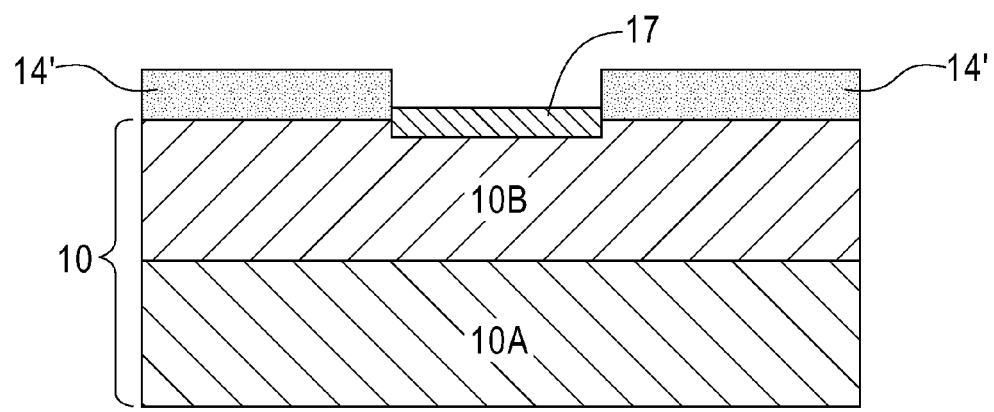
FIG. 6 is a pictorial representation (through a cross sectional view) illustrating the structure of FIG. 3 after forming a metal semiconductor alloy layer into the open grid pattern.
Figure 7:
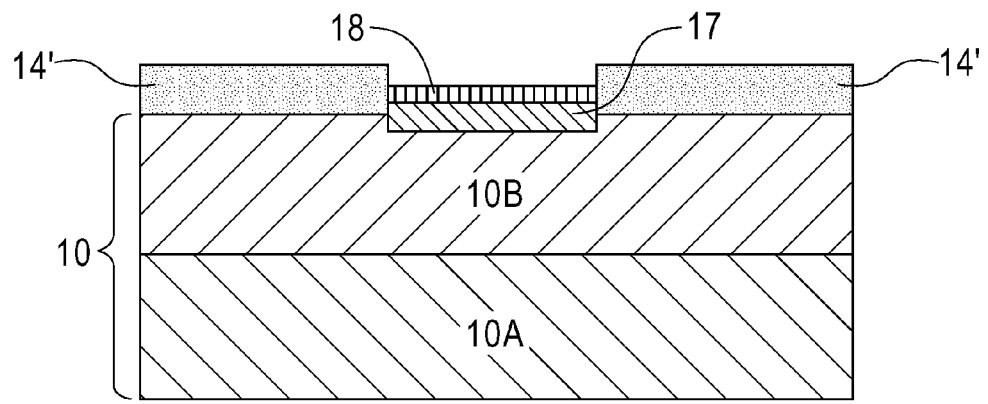
FIG. 7 is a pictorial representation (through a cross sectional view) illustrating the structure of FIG. 6 after electrodepositing, i.e., electroplating, a metal phosphorus layer on the metal semiconductor alloy layer.
Figure 8:
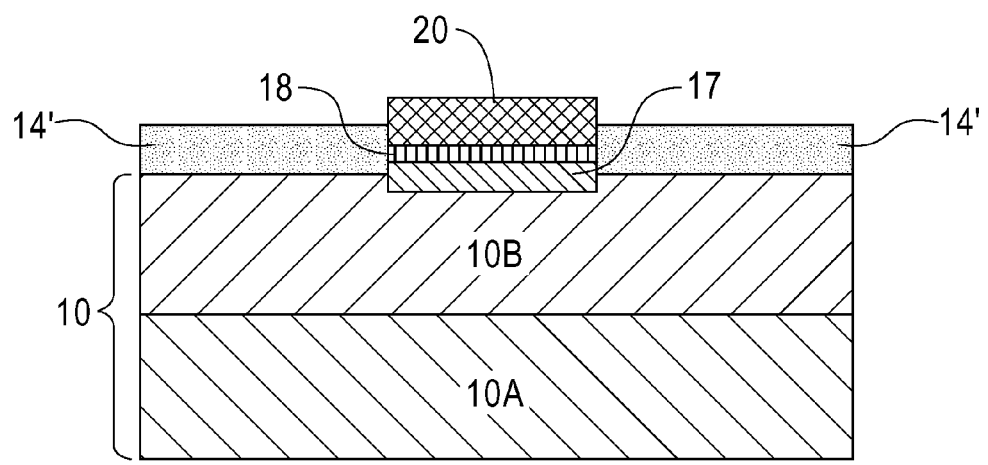
FIG. 8 is a pictorial representation (through a cross sectional view) illustrating the structure of FIG. 7 after electrodepositing a copper-containing layer on an upper surface of the metal phosphorus layer.

Reference is now made to FIGS. 6-8 which illustrate another embodiment of the present disclosure. In this embodiment, a metal semiconductor alloy is formed interposed between the exposed portions of the n-type semiconductor portion 10B of the semiconductor substrate 10 and the overlying metal phosphorus layer 18. In some embodiments (not shown), the metal semiconductor alloy can be formed interposed between the exposed portion of the p-type semiconductor portion when the substrate comprises a p-type semiconductor portion atop an n-type semiconductor portion.

Specifically, FIG. 6 illustrates the structure of FIG. 3 after forming a metal semiconductor alloy layer 17 into the open grid pattern 16, i.e., atop the exposed portions of the n-type semiconductor portion 10B of the semiconductor substrate 10 that are not covered by the patterned ARC layers 14'. The metal semiconductor alloy layer 17 is formed by providing a metal layer (not shown) onto the exposed portions of the n-type semiconductor portion 10B of the semiconductor substrate 10 that are not protected by the patterned ARC layers 14', and then subjecting the structure to an anneal. During the anneal, metal atoms from the metal layer react with semiconductor atoms from the underlying n-type semiconductor portion 10B forming a metal semiconductor alloy 17. The metal semiconductor alloy layer 17 thus consists of a metal and a semiconductor. In one embodiment, the metal semiconductor alloy layer 17 comprises a metal silicide such as, for example, NiSi or CoSi. In another embodiment, the metal semiconductor alloy layer 17 comprised a metal germanide such as, for example, Ni germanide or Co germanide.

The metal layer (which is not shown) can be formed by electrodeposition. The electrodeposition process is the same has used above in forming the metal phosphorus layer 18 except that no phosphorus ions are present in the plating bath. Light illumination as described above can also be used in conjunction with electrodeposition to form the metal layer.

In one embodiment of the present disclosure, the metal layer comprises a Ni layer. In another embodiment, the metal layer comprises a Co layer. In other embodiments, the metal layer comprises one of Zn, Pt, Ag, Pd, Sn, Fe and In.

The thickness of the metal layer that is formed and is used in forming the metal semiconductor alloy layer 17 is typically within the range from 20 nm to 500 nm, with a thickness from 100 nm to 300 nm being more typically. Other thicknesses that are above or below the aforementioned thickness ranges can also be employed in the present application.

After forming the metal layer, and as mentioned above, an anneal is performed that causes metal atoms from the metal layer to react with semiconductor atoms from the underlying semiconductor substrate 10 forming the metal semiconductor alloy layer 17. The anneal may be performed in a single step or a two-step anneal process can be used. In one embodiment, the anneal is performed at a temperature of about 250° C. or greater. In another embodiment, the anneal is performed at a temperature from 300° C. to 700° C. Annealing can be performed in air, forming gas, He, Ar, or N$_2$. The anneal includes a furnace anneal, a rapid thermal anneal, a spike anneal, a microwave anneal or a laser anneal. Typically, the anneal is a rapid thermal anneal or a belt furnace anneal in which the anneal time is about typically less than 5 minute. Following the final anneal step, any unreacted metal layer is removed from the structure utilizing an etching process that selectively removes the unreacted metal from the structure.

The metal semiconductor alloy layer 17 that is formed after annealing has a thickness that is typically from 20 nm to 300 nm, with a thickness from 50 nm to 150 nm being more typical. Other thicknesses above and below the aforementioned ranges are also possible depending on the initial thickness of the metal layer and the conditions of the anneal used to convert the metal layer to the metal semiconductor alloy layer 17.

In some embodiments, and as shown in FIG. 6, the metal semiconductor alloy layer 17 is a continuous layer. By "continuous", it is meant that the metal semiconductor alloy layer 17 that is formed has no breaks in the entire length of the substrate that it is formed upon. In another embodiment, the metal semiconductor alloy layer 17 is discontinuous, i.e., there is at least one break in the metal semiconductor alloy layer 17 such that the entire surface of the underlying substrate is not completely covered by the metal semiconductor alloy layer 17. It is noted that a continuous metal semiconductor alloy layer 17 is not necessary in the present disclosure since the metal phosphorus layer 18 (to be subsequently formed atop the metal semiconductor alloy layer 17) serves as a diffusion barrier in the disclosed structure.

Referring now to FIG. 7, there is illustrated the structure of FIG. 6 after electrodepositing, i.e., electroplating, a metal phosphorus layer 18 on the metal semiconductor alloy layer 17. The metal phosphorus layer 18 employed in this embodiment of the present disclosure is the same as that described above. Also, the electrodeposition method described in forming the metal phosphorus layer 18 can also be used in this embodiment as well.

Referring now to FIG. 8, there is illustrated the structure of FIG. 7 after electrodepositing a copper-containing layer 20 on an upper surface of the metal phosphorus layer 18. The copper-containing layer 10 employed in this embodiment of the present disclosure is the same as that described above. Also, the electrodeposition method described in forming the copper-containing layer 20 can also be used in this embodiment as well.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A photovoltaic device comprising:
   a semiconductor substrate including a p-n junction with a p-type semiconductor portion and an n-type semiconductor portion one on top of the other, wherein an upper exposed surface of one of the semiconductor portions represents a front side surface of the semiconductor substrate;
   patterned antireflective coatings on the front side surface of the semiconductor substrate, wherein said patterned antireflective coatings protect some of the semiconductor portions of the front side surface of the semiconductor substrate, while leaving other of the semiconductor portions of the front side surface of the semiconductor substrate exposed, said other of the semiconductor portions of the front side surface of the semiconductor substrate that are exposed form a grid pattern on the front side surface;
   a metal phosphorus layer located directly on the other of the semiconductor portions of the front side surface of the semiconductor substrate that are exposed, wherein vertical sidewalls of said metal phosphorus layer are in direct contact with a vertical sidewall portion of the patterned antireflective coatings; and
   a copper-containing layer located atop the metal phosphorus layer, said copper-containing layer having vertical sidewalls that are vertically coincident to said vertical sidewalls of said metal phosphorus layer, wherein said vertical sidewalls of said copper-containing layer are in direct physical contact with another vertical sidewall portion of said patterned antireflective coatings and a topmost surface that is located above a topmost surface of said patterned antireflective coatings.

2. The semiconductor structure of claim 1, wherein said metal phosphorus layer comprises from 1 atomic % to 30 atomic % phosphorus.

3. The semiconductor structure of claim 1, wherein said metal phosphorus layer comprises Ni or Co as a metal component.

4. The semiconductor structure of claim 1, wherein said metal phosphorus layer comprises nickel phosphorus and said copper-containing layer comprises copper.

5. The semiconductor structure of claim 1, wherein said metal phosphorus layer comprises cobalt phosphorus and said copper-containing layer comprises copper.

6. The semiconductor structure of claim 1, wherein said semiconductor substrate is a component of a solar cell.

7. The semiconductor structure of claim 1, wherein said p-type semiconductor portion is located beneath the n-type semiconductor portion.

8. The semiconductor structure of claim 1, wherein an entire upper surface of said patterned antireflective coatings is planar.

9. A photovoltaic device comprising:
   a semiconductor substrate including a p-n junction with a p-type semiconductor portion and an n-type semiconductor portion one on top of the other, wherein an upper exposed surface of one of the semiconductor portions represents a front side surface of the semiconductor substrate;
   patterned antireflective coatings on the front side surface of the semiconductor substrate, wherein said patterned antireflective coatings protect some of the semiconductor portions of the front side surface of the semiconductor substrate, while leaving other of the semiconductor portions of the front side surface of the semiconductor substrate exposed, said other of the semiconductor portions of the front side surface of the semiconductor substrate that are exposed form a grid pattern on the front side surface;
   a metal semiconductor alloy layer located directly on the other of the semiconductor portions of the front side surface of the semiconductor substrate that are exposed, wherein said metal semiconductor alloy layer has a bottommost surface that is located beneath a topmost surface of said semiconductor substrate, a topmost surface located above said topmost surface of said semiconductor substrate, and upper vertical sidewalls that are in direct contact with a first vertical sidewall portion of the patterned antireflective coatings;
   a metal phosphorus layer located directly on said topmost surface of said metal semiconductor alloy portion, wherein vertical sidewalls of said metal phosphorus layer are in direct contact with a second vertical sidewall portion of the patterned antireflective coatings; and
   a copper-containing layer located atop the metal phosphorus layer, said copper-containing layer having vertical sidewalls that are vertically coincident to said vertical sidewalls of said metal phosphorus layer, wherein said vertical sidewalls of said copper-containing layer are in direct physical contact with a third vertical sidewall portion of said patterned antireflective coatings and a topmost surface that is located above a topmost surface of said patterned antireflective coatings.

10. The semiconductor structure of claim 9, wherein said metal semiconductor alloy layer is a continuous layer.

11. The semiconductor structure of claim 9, wherein said metal semiconductor alloy is a discontinuous layer.

12. The semiconductor structure of claim 9, wherein said metal phosphorus layer comprises nickel phosphorus, said copper-containing layer comprises copper, and said metal semiconductor alloy layer comprises a nickel silicide layer.

13. The semiconductor structure of claim 9, wherein said metal phosphorus layer comprises cobalt phosphorus, said copper-containing layer comprises copper, and said metal semiconductor alloy layer comprises a nickel silicide layer.

14. The semiconductor structure of claim 9, wherein said metal phosphorus layer comprises from 1 atomic % to 30 atomic % phosphorus.

15. The semiconductor structure of claim 9, wherein said metal phosphorus layer comprises Ni or Co as a metal component.

16. The semiconductor structure of claim 9, wherein said semiconductor substrate is a component of a solar cell.

17. The semiconductor structure of claim 9, wherein said p-type semiconductor portion is located beneath the n-type semiconductor portion.

18. The semiconductor structure of claim 9, wherein an entire upper surface of said patterned antireflective coatings is planar.

\* \* \* \* \*